US012587171B2

(12) United States Patent
Shen

(10) Patent No.: US 12,587,171 B2
(45) Date of Patent: Mar. 24, 2026

(54) PASSBAND FILTER COMBINING TWO SETS OF COMPONENTS

(71) Applicant: Skyworks Solutions, Inc., Irvine, CA (US)

(72) Inventor: Ya Shen, Huntersville, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 339 days.

(21) Appl. No.: 18/123,197

(22) Filed: Mar. 17, 2023

(65) Prior Publication Data

US 2023/0299747 A1 Sep. 21, 2023

Related U.S. Application Data

(60) Provisional application No. 63/321,552, filed on Mar. 18, 2022.

(51) Int. Cl.
*H03H 9/70* (2006.01)
*H03H 9/54* (2006.01)
*H03H 9/56* (2006.01)

(52) U.S. Cl.
CPC ............ *H03H 9/706* (2013.01); *H03H 9/542* (2013.01); *H03H 9/568* (2013.01)

(58) Field of Classification Search
CPC ............... H03H 9/54; H03H 9/56; H03H 9/70
See application file for complete search history.

(56) References Cited

U.S. PATENT DOCUMENTS

| | | | |
|---|---|---|---|
| 5,006,824 | A | 4/1991 | Paff |
| 5,581,141 | A | 12/1996 | Yamada et al. |
| 5,729,186 | A | 3/1998 | Seki et al. |
| 5,932,950 | A | 8/1999 | Yamada et al. |
| 6,297,580 | B1 | 10/2001 | Takayama et al. |
| 6,584,090 | B1 | 6/2003 | Abdelgany et al. |
| 7,965,155 | B2 | 6/2011 | Nakamura et al. |
| 8,035,460 | B2 | 10/2011 | Nakanishi et al. |
| 8,072,293 | B2 | 12/2011 | Nakamura et al. |
| 8,084,916 | B2 | 12/2011 | Goto et al. |
| 8,436,778 | B2 | 5/2013 | Fujiwara et al. |
| 8,476,991 | B2 | 7/2013 | Goto et al. |
| 8,482,363 | B2 | 7/2013 | Fujiwara et al. |

(Continued)

*Primary Examiner* — Andrea Lindgren Baltzell
*Assistant Examiner* — Alan Wong
(74) *Attorney, Agent, or Firm* — Knobbe, Martens, Olson & Bear, LLP

(57) ABSTRACT

According to the present disclosure, a passband filter is provided. The passband filter has a series branch, where the series branch comprises a set of one or more resonators having a resonant frequency sufficiently away from the passband of the filter such that spurious modes, of the set of one or more resonators, that are associated with the resonant frequency are outside of the passband of the filter; a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

20 Claims, 16 Drawing Sheets

(56) References Cited

U.S. PATENT DOCUMENTS

| | | | |
|---|---|---|---|
| 8,487,720 B2 | 7/2013 | Fujiwara et al. | |
| 8,698,578 B2 | 4/2014 | Nakanishi et al. | |
| 9,035,725 B2 | 5/2015 | Komatsu et al. | |
| 9,036,091 B2 | 5/2015 | Hendrickson et al. | |
| 9,093,967 B2 | 7/2015 | Gorbachov | |
| 9,405,875 B1 * | 8/2016 | McHugh | H03H 9/465 |
| 9,413,330 B2 | 8/2016 | Shimizu et al. | |
| 9,419,584 B2 | 8/2016 | Tsurunari et al. | |
| 9,425,766 B2 | 8/2016 | Fujiwara et al. | |
| 10,097,159 B2 | 10/2018 | Komatsu et al. | |
| 10,187,038 B2 * | 1/2019 | Tani | H03H 9/64 |
| 10,187,039 B2 | 1/2019 | Komatsu et al. | |
| 10,211,799 B2 * | 2/2019 | Tani | H03H 9/542 |
| 10,491,194 B2 | 11/2019 | Komatsu et al. | |
| 10,530,331 B2 | 1/2020 | Yamaji et al. | |
| 10,547,283 B2 * | 1/2020 | Tajic | H03H 9/175 |
| 10,756,704 B2 * | 8/2020 | Sauer | H03H 9/6483 |
| 10,931,260 B2 | 2/2021 | Yamaji et al. | |
| 11,095,269 B2 | 8/2021 | Komatsu | |
| 11,146,229 B2 * | 10/2021 | Kato | H03H 9/605 |
| 11,165,411 B2 | 11/2021 | Liu et al. | |
| 11,444,599 B2 | 9/2022 | Sasaki et al. | |
| 11,451,212 B2 | 9/2022 | Komatsu et al. | |
| 11,476,835 B2 * | 10/2022 | Nosaka | H04B 1/40 |
| 11,489,513 B2 | 11/2022 | Goto | |
| 11,502,668 B2 | 11/2022 | Goto | |
| 11,545,960 B2 | 1/2023 | Goto | |
| 11,563,423 B2 | 1/2023 | Komatsu et al. | |
| 11,909,382 B2 * | 2/2024 | Tani | H03H 9/0004 |
| 11,929,737 B2 * | 3/2024 | Takata | H03H 9/02992 |
| 2010/0060102 A1 | 3/2010 | Goto et al. | |
| 2010/0097161 A1 | 4/2010 | Nakamura et al. | |
| 2010/0164646 A1 | 7/2010 | Nakanishi et al. | |
| 2010/0194496 A1 | 8/2010 | Goto et al. | |
| 2010/0219905 A1 | 9/2010 | Nakamura et al. | |
| 2011/0043428 A1 | 2/2011 | Fujiwara et al. | |
| 2011/0063046 A1 | 3/2011 | Fujiwara et al. | |
| 2011/0215883 A1 | 9/2011 | Fujiwara et al. | |
| 2012/0044027 A1 | 2/2012 | Nakanishi et al. | |
| 2012/0176550 A1 | 7/2012 | Hendrickson et al. | |
| 2012/0280754 A1 | 11/2012 | Gorbachov | |
| 2013/0210374 A1 | 8/2013 | Fujiwara et al. | |
| 2014/0285287 A1 | 9/2014 | Komatsu et al. | |
| 2016/0056791 A1 | 2/2016 | Shimizu et al. | |
| 2016/0226464 A1 | 8/2016 | Fujiwara et al. | |
| 2016/0268997 A1 | 9/2016 | Komatsu et al. | |
| 2017/0353174 A1 | 12/2017 | Komatsu et al. | |
| 2018/0109238 A1 | 4/2018 | Yamaji et al. | |
| 2019/0074819 A1 | 3/2019 | Goto et al. | |
| 2019/0149132 A1 | 5/2019 | Komatsu | |
| 2019/0199323 A1 * | 6/2019 | Tsukamoto | H03H 9/706 |
| 2019/0386642 A1 | 12/2019 | Komatsu | |
| 2020/0127639 A1 | 4/2020 | Yamaji et al. | |
| 2020/0162054 A1 | 5/2020 | Goto | |
| 2020/0162055 A1 | 5/2020 | Goto | |
| 2020/0162056 A1 | 5/2020 | Goto | |
| 2020/0177159 A1 | 6/2020 | Liu et al. | |
| 2020/0358464 A1 | 11/2020 | Abbott et al. | |
| 2020/0403601 A1 | 12/2020 | Komatsu et al. | |
| 2021/0067127 A1 | 3/2021 | Sasaki et al. | |
| 2021/0067134 A1 | 3/2021 | Fujiwara et al. | |
| 2021/0067136 A1 | 3/2021 | Fujiwara et al. | |
| 2021/0105004 A1 | 4/2021 | Komatsu et al. | |
| 2021/0119650 A1 | 4/2021 | Abbott et al. | |
| 2021/0336605 A1 | 10/2021 | Komatsu | |
| 2022/0014177 A1 | 1/2022 | Liu et al. | |
| 2022/0368312 A1 | 11/2022 | Wang et al. | |
| 2023/0016884 A1 | 1/2023 | Goto et al. | |

* cited by examiner

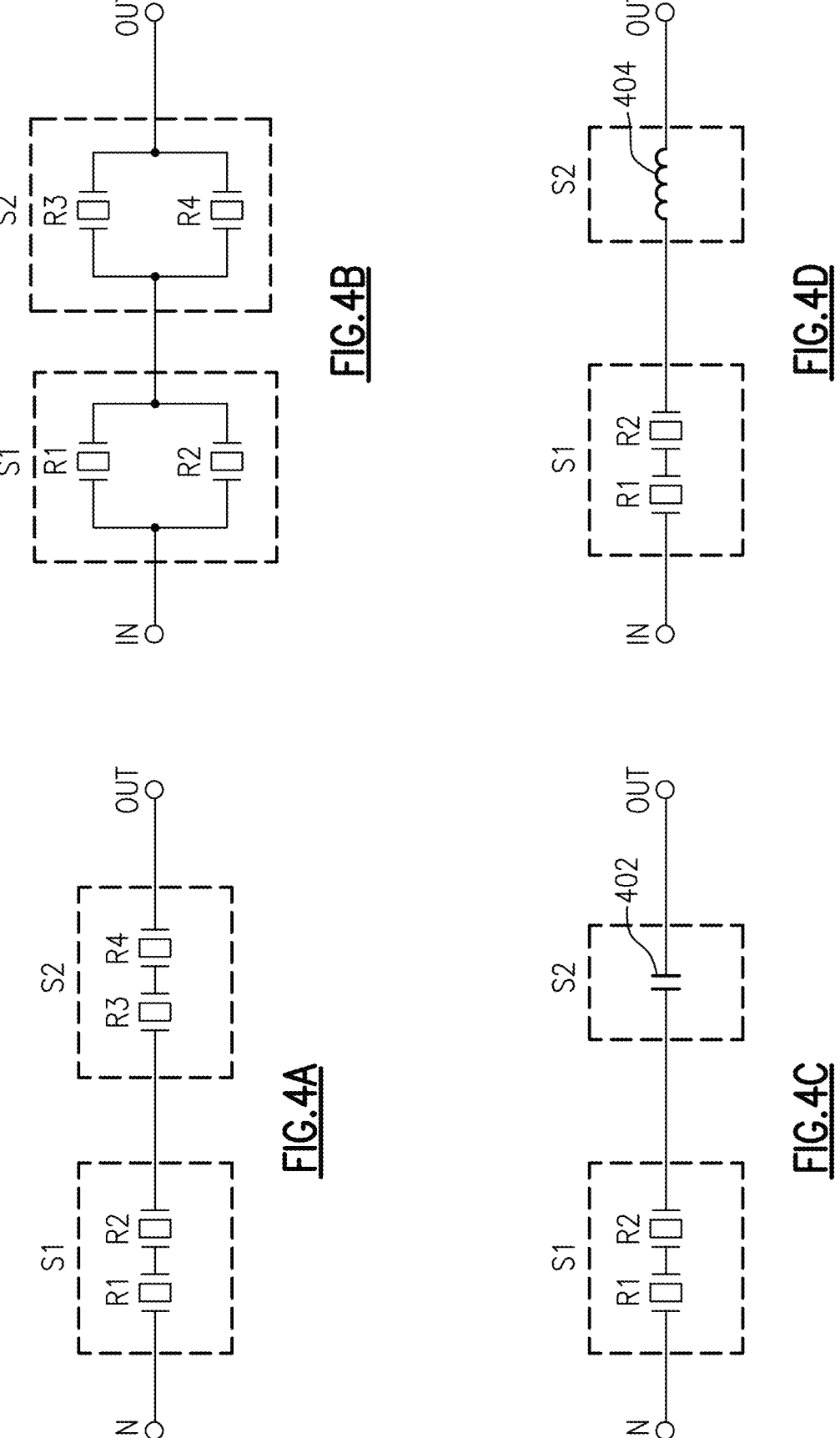

RF_freq, GHz

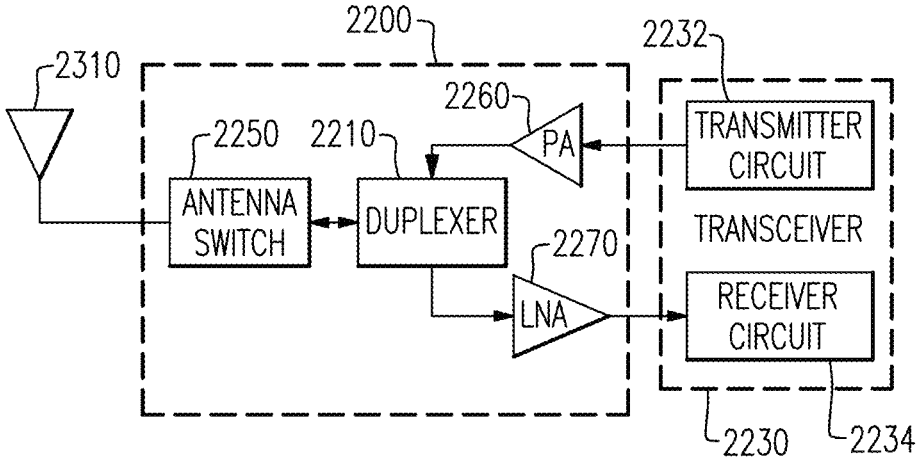
<u>FIG.11</u>

1

PASSBAND FILTER COMBINING TWO SETS OF COMPONENTS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to passband filters, such as for use in radio-frequency front end (RFFE) modules. Embodiments of the invention also relate to radio-frequency (RF) modules and wireless devices comprising said passband filters.

Description of the Related Technology

Acoustic wave devices may be utilized as components of filters in radio frequency electronic systems. For instance, filters in a radio frequency front end of a mobile phone can include acoustic wave filters. Filters include passband filters. The acoustic wave devices that are used in a filter affect the performance of the filter and the range of frequencies in which it can operate.

A type of acoustic wave device commonly used in passband filters is a bulk acoustic wave (BAW) resonator. A commonly used topology is a ladder structure. In some arrangements, BAW resonators may have spurious modes around their resonance frequency, especially for series resonators, degraded second order harmonics (H2) introduced by these spurious modes appear within the passband. When the spurious modes is generated in the first series branch closest to the antenna port, degraded H2 are therefore not attenuated by the filter itself and can go out from the filter into the system. New filter topology is required to suppress filter generated H2 and produce a cleaner, better quality signal in the first series branch of the passband of the filter.

SUMMARY

According to one embodiment there is provided a radio frequency passband filter with a series branch, the series branch comprising a set of one or more resonators having a resonant frequency sufficiently away from the passband of the filter such that spurious modes, of the set of one or more resonators, that are associated with the resonant frequency are outside of the passband of the filter and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

Optionally, the one or more reactive components are one or more inductors.

Optionally, the one or more reactive components are one or more capacitors.

Optionally, the one or more reactive components are one or more resonators.

Optionally, the set of one or more resonators has a resonant frequency above the passband of the filter.

Optionally, the set of one or more resonators has a resonant frequency below the passband of the filter.

Optionally, the set of one or more reactive components has a resonant frequency above the passband of the filter and sufficiently above/away from the resonance frequency of the set of one or more resonators.

Optionally, the set of one or more reactive components has a resonant frequency below the passband of the filter and sufficiently below/away from the resonance frequency of the set of one or more resonators.

Optionally, the first set of one or more resonators has at least two resonators, the at least two resonators being connected in series to one another or anti-parallel to one another.

Optionally, the second set of one or more resonators has at least two resonators, the at least two resonators being connected in series to one another or anti-parallel to one another.

Optionally, the first and second set of one or more resonators are located at a first series stage, towards an antenna port, of a ladder filter.

Optionally the series branch further comprises an inductor connected in parallel with the first set of one or more resonators. The inductor has an inductance sufficient to move the anti-resonance frequency of the first set of one or more resonators out of the passband. Optionally, the inductor is a 4 nH inductor.

Optionally the second set of one or more resonators has a resonance frequency sufficiently above the passband of the filter so that the majority of a lateral mode induced second harmonic is outside the passband of the filter. Optionally the second set of one or more resonators has a resonance frequency around 100 MHz above the upper edge of the passband.

Optionally, the one or more resonators of each of the first and second set of one or more resonators are bulk acoustic wave (BAW) resonators.

Optionally, the passband filter further comprises a substrate, where the first and second set of one or more resonators are disposed on a substrate. Optionally the substrate is a silicon wafer.

Optionally, the one or more resonators of each of the first and second set of one or more resonators are surface acoustic wave (SAW) resonators.

Optionally, the one or more resonators of the first set have a piezoelectric layer of a first material, and the one or more resonators of the second set have a piezoelectric layer of a second material, such that the combined resonant frequency is within the passband of the filter, and the anti-resonant frequency is outside of the passband of the filter. Optionally the first and second materials are the same material. Optionally the first and second materials are the same thickness. Optionally the first and second materials are a different thickness to each other. Optionally the one or both of the first material and second material are aluminum nitride. Optionally the one or both of the first material and second material are lithium tantalite.

Optionally the passband is 2496 MHz to 2690 MHz.

According to another embodiment there is provided a method of using a circuit to apply a passband filter to a radio frequency signal, the circuit comprising a passband filter with a series branch, the series branch comprising, a set of one or more resonators having a resonant frequency sufficiently away from the passband of the filter such that spurious modes, of the set of one or more resonators, that are associated with the resonant frequency are outside of the passband of the filter and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

According to another embodiment there is provided a radio-frequency module comprising, a set of one or more resonators having a resonant frequency sufficiently away from the passband of the filter such that spurious modes of the set of one or more resonators, that are associated with the resonant frequency are outside of the passband of the filter and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

According to another embodiment there is provided a semiconductor die comprising a radio frequency passband filter with a series branch, the series branch comprising, a set of one or more resonators having a resonant frequency sufficiently away from the passband of the filter such that spurious modes, of the set of one or more resonators, that are associated with the resonant frequency are outside of the passband of the filter and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

According to another embodiment there is provided a wireless mobile device comprising, one or more antennas, and a radio-frequency module that communicates with the one or more antennas, the radio-frequency module having a die including a radio frequency passband filter with a series branch, the series branch having a set of one or more resonators having a resonant frequency sufficiently away from the passband of the filter such that spurious modes, of the set of one or more resonators, that are associated with the resonant frequency are outside of the passband of the filter and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described is optional and may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 4A is a first stage of a series branch of a ladder filter according to an embodiment of the invention;

FIG. 4B is a first stage of a series branch of a ladder filter according to an embodiment of the invention;

FIG. 4C is a first stage of a series branch of a ladder filter comprising a capacitor according to an embodiment of the invention;

FIG. 4D is a first stage of a series branch of a ladder filter comprising an inductor according to an embodiment of the invention;

FIG. 11 is a schematic of a radio frequency front end module incorporating aspects of the present invention.

DETAILED DESCRIPTION

Aspects and embodiments described herein are directed to a passband filter such as for use in radio-frequency (RF) and radio-frequency front end RFFE modules, having an improved frequency response with less noise in the frequency response, and the harmonic response.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
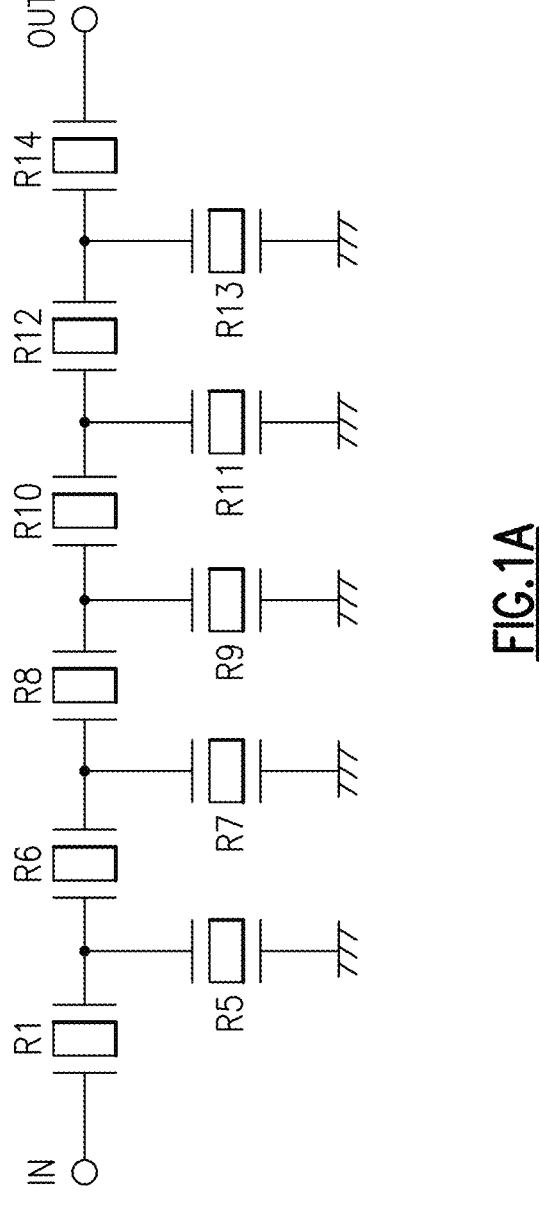
FIG. 1A is a known ladder filter.

Bulk acoustic wave (BAW) resonators may be combined to form a filter structure that may operate in the radio frequency (RF) band. One type of a BAW resonator-based RF filter is known as a ladder filter. One example of a ladder filter is illustrated in FIG. 1A. The filter of FIG. 1A includes a plurality of BAW resonators R1, R5, R6, R7, R8, R9, R10, R11, R12, R13, R14. Resonators R1, R6, R8, R10, R12 and R14 are connected in series between the input port (IN) and the output port (OUT). Resonators R5, R7, R9, R11 and R13 are connected in parallel between resonators R1, R6, R8, R10, R12 and R14 and ground. Resonators R5, R7, R9, R11 and R13 may also be referred to as shunt resonators. In some embodiments, each of the series resonators R1, R6, R8, R10, R12 and R14 may have the same resonant frequency. Each of the plurality of shunt resonators R5, R7, R9, R11 and R13 have a resonant frequency below the resonant frequency of each of the series arm resonators R1, R6, R8, R10, R12 and R14. At least one of the plurality of shunt resonators R5, R7, R9, R11 and R13 may have a first resonant frequency different from resonant frequencies of others of the plurality of shunt resonators, or the shunt resonators may all have the same resonant frequency. At least one of the plurality of shunt resonators R5, R7, R9, R11 and R13 may have a second resonant frequency different from the first resonant frequency and different from the resonant frequencies of others of the plurality of shunt resonators.

Figure 1B:
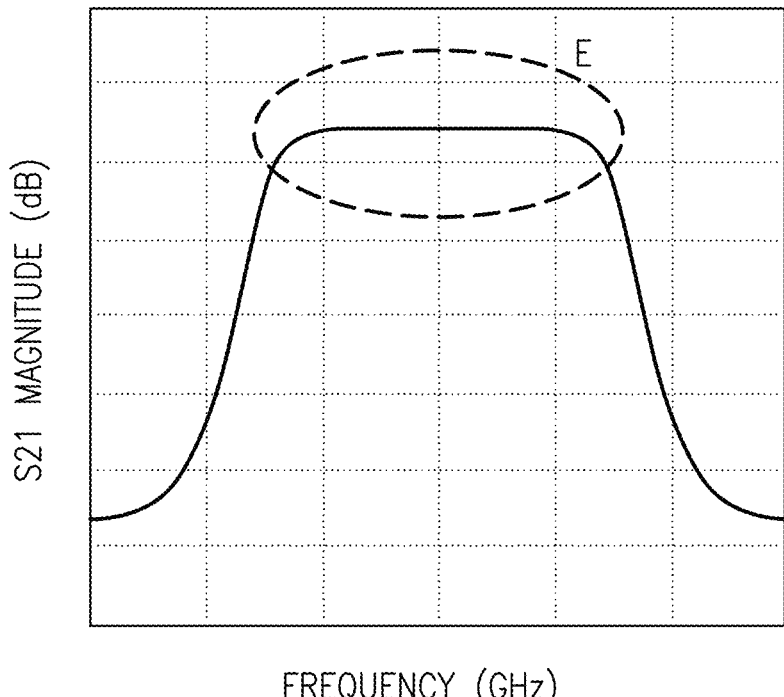
FIG. 1B is a frequency response of a known passband filter.

The filter of FIG. 1A acts as a passband filter, of the sort often provided in radio-frequency front end (RFFE) mod-ules. Such a passband filter has a frequency response as illustrated in FIG. 1B, where the S21 magnitude (dB) is shown against frequency (GHz). The filter allows a range of frequencies to pass through, with signals having frequencies outside of this range being suppressed. This is shown by the dashed area E, where signals whose frequencies are within the passband shown by E are allowed through, whereas frequencies outside of this passband have a rapidly decreasing magnitude the further out of the passband the frequency is. The series resonators R1, R6, R8, R10, R12 and R14 define the upper frequency limit of the passband filter, whilst the shunt resonators R5, R7, R9, R11 and R13 define the lower frequency limit. FIG. 1B shows a clean passband. However, in some arrangements, the passband may not be clean, and instead ripples may be present, reducing the magnitude of the passband response at a range of frequencies, due to spurious modes in the frequency responses of the resonators within the ladder filter.

Figures 2A, 2B:
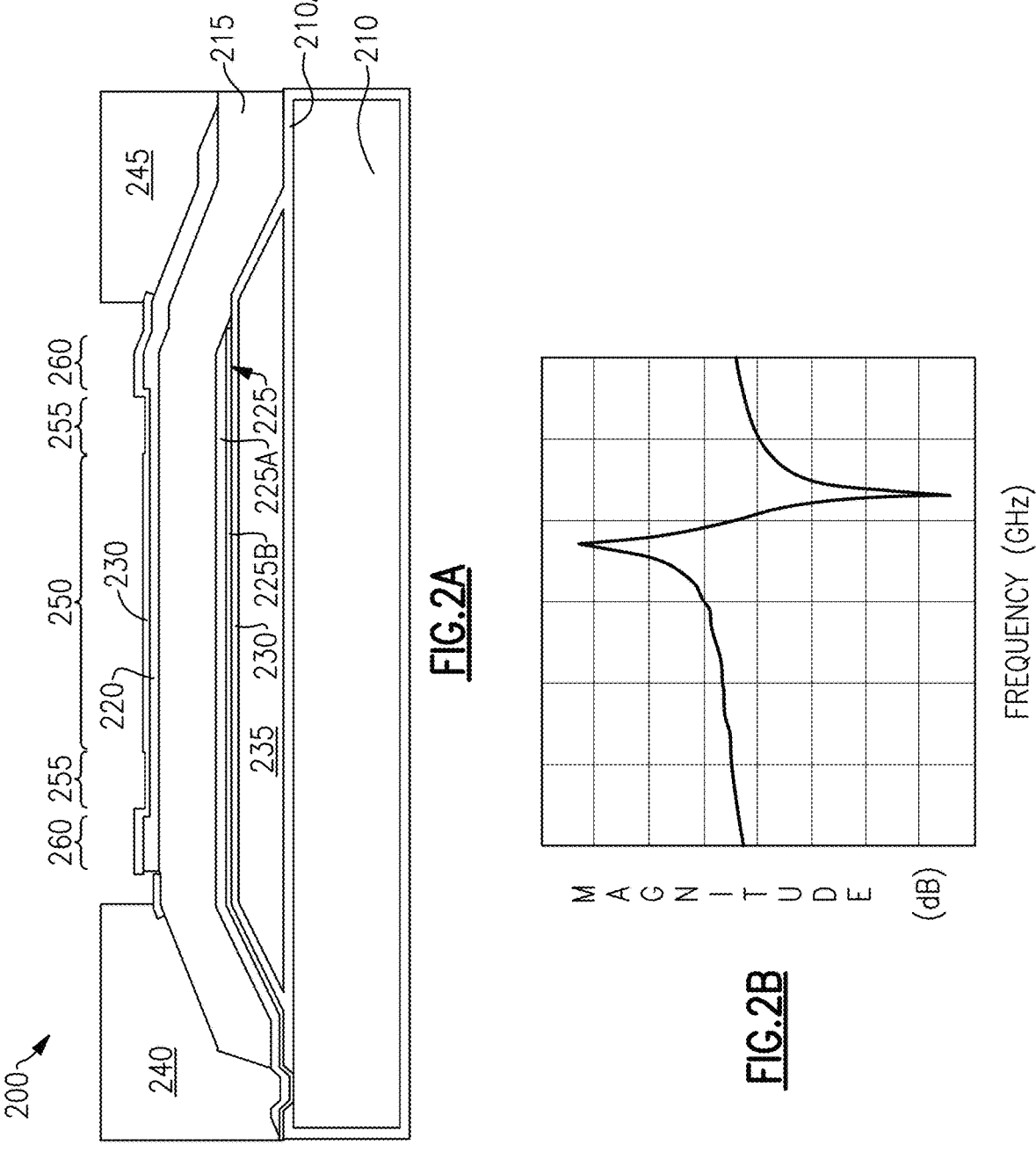
FIG. 2A is a FBAR type BAW resonator.
FIG. 2B is a frequency response of a BAW resonator.

FIG. 2A is cross-sectional view of an example of a FBAR type BAW resonator, indicated generally at 200. The BAW resonator 200 is disposed on a substrate 210, for example, a silicon substrate that may include a dielectric surface layer 210A of, for example, silicon dioxide. The BAW resonator 200 includes a layer or film of piezoelectric material 215, for example, aluminum nitride (AlN). A top electrode 220 is disposed on top of a portion of the layer or film of piezoelectric material 215 and a bottom electrode 225 is disposed on the bottom of a portion of the layer or film of piezoelectric material 215. The top electrode 220 may be formed of, for example, ruthenium (Ru). The bottom electrode 225 may include a layer 225A of Ru disposed in contact with the bottom of the portion of the layer or film of piezoelectric material 215 and a layer 225B of titanium (Ti) disposed on a lower side of the layer 225A of Ru opposite a side of the layer 225A of Ru in contact with the bottom of the portion of the layer or film of piezoelectric material 215. Each of the top electrode 220 and the bottom electrode 225 may be covered with a layer of dielectric material 230, for example, silicon dioxide. A cavity 235 is defined beneath the layer of dielectric material 230 covering the bottom electrode 225 and the surface layer 210A of the substrate 210, and is an air cavity. A bottom electrical contact 240 formed of, for example, copper may make electrical connection with the bottom electrode 225 and a top electrical contact 245 formed of, for example, copper may make electrical connection with the top electrode 220.

The BAW resonator 200 may include a central region 250 including a main active domain in the layer or film of piezoelectric material 215 in which a main acoustic wave is excited during operation. A recessed frame region or regions 255 may bound and define the lateral extent of the central region 250. The recessed frame region(s) 255 may be defined by areas that have a thinner layer of dielectric material 230 on top of the top electrode 220 than in the central region 250. The dielectric material layer 230 in the recessed frame region(s) 255 may be from about 10 nm to about 200 nm thinner than the dielectric material layer 230 in the central region 250 and/or the difference in thickness of the dielectric material in the recessed frame region(s) 255 vs. in the central region 250 may cause the resonant frequency of the device in the recessed frame region(s) 255 to be between about 5 MHz to about 50 MHz higher than the resonant frequency of the device in the central region 250. A raised frame region or regions 260 may be defined on an opposite side of the recessed frame region(s) 255 from the central region 250 and may directly abut the outside edge(s) of the recessed frame region(s) 255. The raised frame region(s) 260 may be defined by areas where the top electrode 220 is thicker than in the central region 250 and in the recessed frame region(s) 255. The top electrode 220 may have the same thickness in the central region 250 and in the recessed frame region(s) 255 but a greater thickness in the raised frame region(s) 260. The top electrode 220 may be between about 50 nm and about 500 nm thicker in the raised frame region(s) 260 than in the central region 250 and/or in the recessed frame region(s) 255. The raised frame region(s) may be, for example, 4 μm or more in width.

The recessed frame region(s) 255 and the raised frame region(s) 260 may contribute to dissipation or scattering of transverse acoustic waves generated in the BAW resonator 200 during operation and/or may reflect transverse waves propagating outside of the recessed frame region(s) 255 and the raised frame region(s) 260 and prevent these transverse acoustic waves from entering the central region and inducing spurious signals in the main active domain region of the BAW resonator. Without being bound to a particular theory, it is believed that due to the thinner layer of dielectric material 230 on top of the top electrode 220 in the recessed frame region(s) 255, the recessed frame region(s) 255 may exhibit a higher velocity of propagation of acoustic waves than the central region 250. Conversely, due to the increased thickness and mass of the top electrode 220 in the raised frame region(s) 260, the raised frame regions(s) 260 may exhibit a lower velocity of propagation of acoustic waves than the central region 250 and a lower velocity of propagation of acoustic waves than the recessed frame region(s) 255. The discontinuity in acoustic wave velocity between the recessed frame region(s) 255 and the raised frame region(s) 260 creates a barrier that scatters, suppresses, and/or reflects transverse acoustic waves.

FIG. 2B illustrates the frequency response of a typical BAW resonator, such as the BAW resonator described with respect to FIG. 2A. It can be seen in FIG. 2B that the BAW resonator displays a resonance and an anti-resonance at nearby frequencies. Above the resonant and anti-resonant peaks, the frequency response of the BAW resonator is smooth. However, this is not the case below the resonant and anti-resonant peaks, where the spurious modes are present, as shown by region C in FIG. 2B and therefore the BAW resonator operating in this frequency (i.e., below its resonant frequency) will operate at a reduced efficiency.

As described in relation to FIG. 1A, the ladder filter comprises a multiple series branches of resonators R1, R6, R8, R10, R12 and R14, and one or more shunt resonators. The typical ladder filter requires that the first series resonator, shown as R1 in FIG. 1A, have a resonant frequency within the passband of the ladder filter. At the same time, the ladder filter requires that the anti-resonant frequency is outside the passband. Therefore, spurious modes present close to the resonant frequency of the first series resonator will leave the filter without any attenuation.

Figure 8:
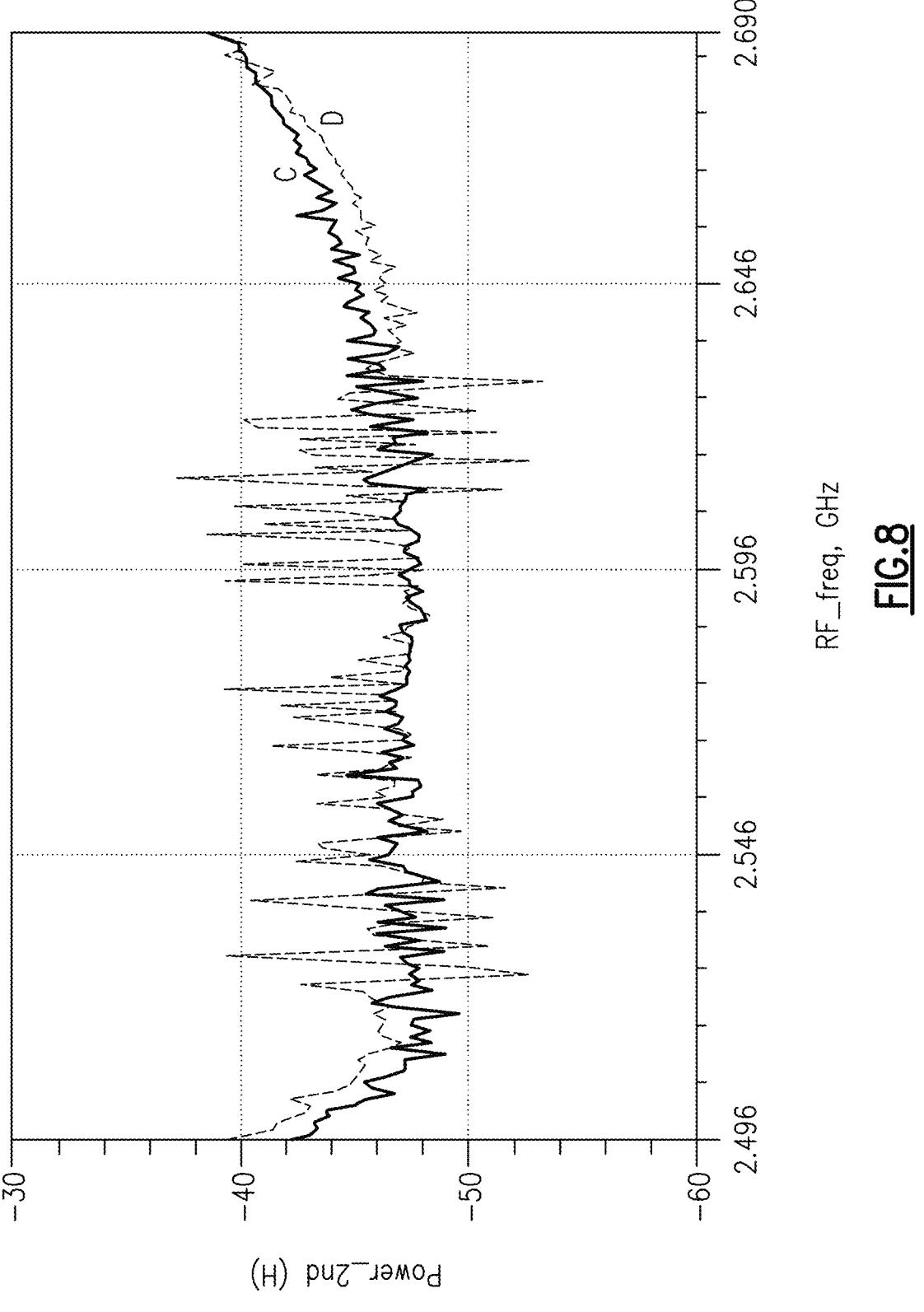
FIG. 8 shows the second harmonic response of an embodiment of the present invention, and a known arrangement.

As will be shown in FIG. 8, and described in relation to this figure in this application, the spurious modes result in harmonic noise. The harmonics of a resonator are important in terms of performance at large signal levels, and this is when the spurious modes are most noticed. It has been appreciated that a ladder filter comprising resonators with minimized spurious modes within the passband, and thus minimized harmonics can improve the performance of a passband filter.

Figure 3A:
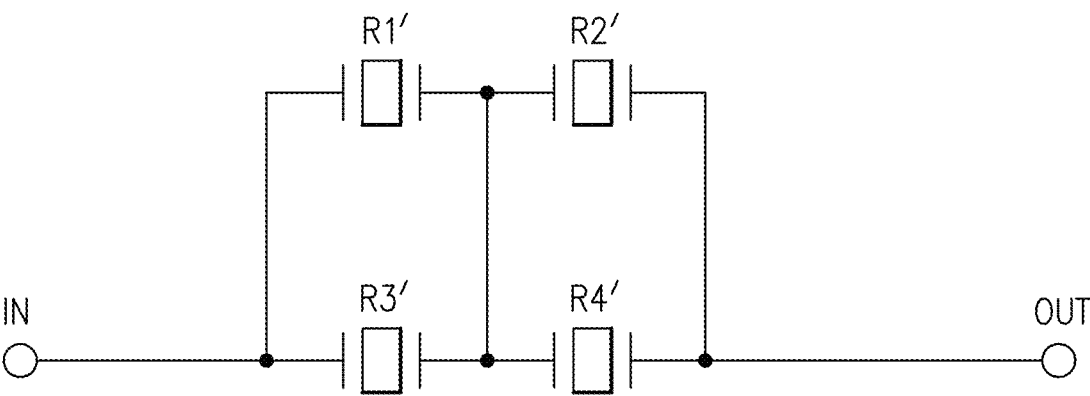
FIG. 3A is a known first stage of a series branch of a ladder filter.
Figure 3B:
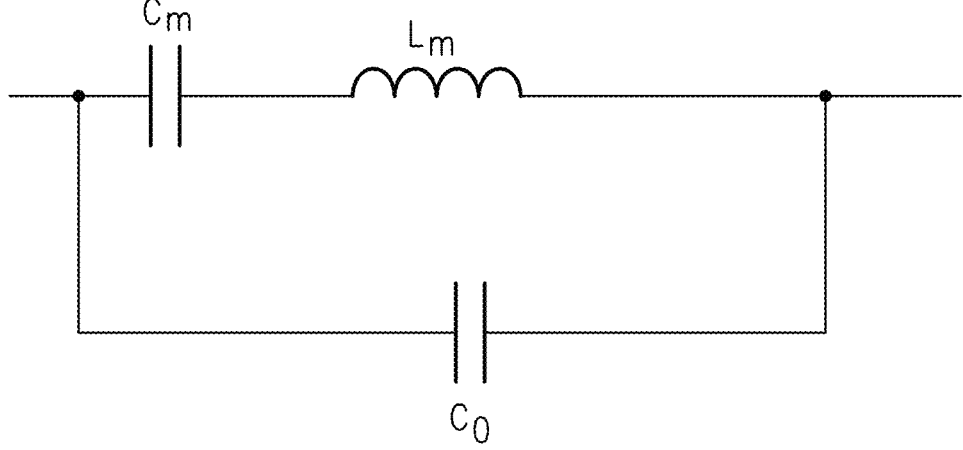
FIG. 3B is a circuit diagram modelling a BAW resonator.
Figure 3C:
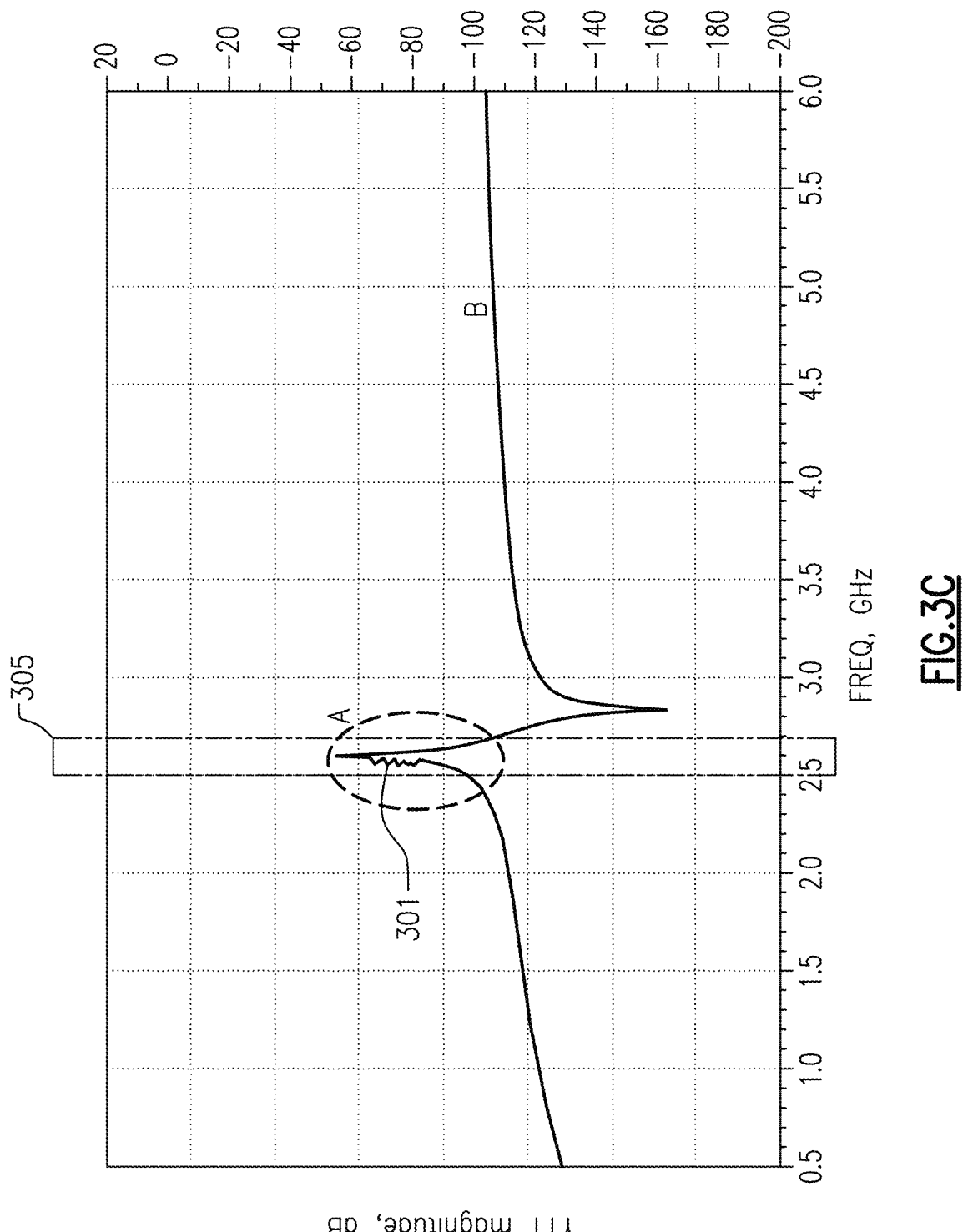
FIG. 3C is frequency response of the known first stage of a series branch of a ladder filter.

FIG. 3A is a circuit diagram of an arrangement of an antenna side first stage of a series branch of a filter, the first stage of the series branch having four resonators. However, in some embodiments there may only be two resonators. In this example the resonators are BAW resonators. In this arrangement the BAW resonators are identical, having the same resonant frequency. The four resonators are connected either in a cascading split, or an anti-parallel split. FIG. 3B shows the lumped circuit diagram model for a BAW resonator, comprising an inductor and two capacitors, such that each resonator, R1', R2', etc. as shown in FIG. 3A can be modelled as comprising an inductor and two capacitors as shown in FIG. 3B. The arrangement produces a frequency response, as shown by line B in FIG. 3C, where the resonant frequency is within the passband 305 shown by the dashed line. As shown, the arrangement of FIG. 3A displays a resonance and anti-resonance at nearby frequencies, such that the resonant frequency is within the passband, and the anti-resonant frequency is outside of the passband, as required by a ladder filter. In this example, the four resonators are chosen such that their combined resonant frequency is within a 2496-2690 MHz passband. However, as shown in FIG. 3C, there are spurious modes 301, in particular lateral modes, present just below resonant frequency, in region A, such that the lateral modes will pass through the filter unattenuated. As will be described herein, the lateral modes affect harmonic performance which affects the performance of the device, looking in particular at the second harmonic contribution of the lateral modes. Although the device of FIG. 3A does cancel the second harmonic contribution from the main mode, which is an improvement on the single resonators of the ladder filter shown in FIG. 1A, the device of FIG. 3A is inefficient for lateral mode suppression.

Therefore, it has been appreciated that an alternative solution for lateral mode suppression is required, by placing a second harmonic trap in the module in the path from the filter antenna port to the antenna.

FIGS. 4A and 4B both illustrate arrangements according to the present disclosure, wherein a passband filter is provided comprising one set of one or more resonators, S1, and one set of one or more reactive components, S2, in series with the one set of one or more resonators. It will be noted that although set S1 is shown as comprising two resonators, the set may comprise any number of resonators. It will be noted that the function of the set of one or more reactive components is to adjust the resonant frequency of the set of one or more resonators. The arrangements of FIGS. 4A and 4B may be located in the series branch of the passband filter, and may be in the antenna side first stage of the series branch.

FIGS. 4A and 4B show two embodiments in which the set of one or more resonators, S1, is two resonators, and the set of one or more reactive components, S2, is two resonators. FIG. 4A illustrates two sets of resonators, S1 and S2, in cascade wherein each set of resonators comprises two resonators in cascade or series arrangement, such that R1 and R2 are defined as a first set, and R3 and R4 are defined as a second set. However, as specified above, in other examples each set may comprise only one resonator, or each set may comprise one or more resonators. FIG. 4B illustrates two sets of resonators, S1 and S2, in cascade wherein each set of resonators comprises two resonators in anti-parallel configuration, such that R1 and R2 are in anti-parallel configuration, and R3 and R4 are in anti-parallel configuration. In other embodiments, not illustrated, one of the sets of resonating components, e.g. S1, may comprise two or more resonating components in cascade, and the other set of resonating components, e.g. S2, may comprise two or more resonating components in anti-parallel configuration. It will be appreciated that in another embodiment, S1 may comprise two or more resonating components in anti-parallel, and S2 may comprise two or resonating components in cascade. In the arrangements of both FIGS. 4A and 4B, the sets of resonators, S1 and S2, are illustrated by the dashed lines. In both arrangements, the two resonators, R1 and R2, of the first set may have the same resonant frequency as each other, and the two resonators, R3 and R4, of the second set may have the same resonant frequency as each other.

FIG. 4C illustrates an embodiment in which the set of one or more resonators, S1, is in series with a capacitor 402. In this embodiment the set of one or more reactive components, S2, is a capacitor 402. It will be appreciated that the capacitor 402 may not be a pure capacitor, and instead may be a component which acts as a capacitor in the active frequency range of the set of one or more resonators, S1. It will be appreciated that in other embodiments the set of one or more reactive components, S2, may comprise more than one capacitor. The capacitor 402 has a resonant frequency sufficiently far away from the passband of the filter such that spurious modes on its main mode have subsided before, and are therefore not present within, the passband of the filter, as will be described herein.

FIG. 4D illustrates an embodiment in which the set of one or more resonators, S1, is in series with an inductor 404. In this embodiment the set of one or more reactive components, S2, is an inductor 404. It will be appreciated that the inductor 404 may not be a pure inductor, and instead may be a component which acts as an inductor in the active frequency range of the set of one or more resonators, S1. It will be appreciated that in other embodiments the set of one or more reactive components, S2, may comprise more than one inductor. The inductor 404 has a resonant frequency sufficiently far away from the passband of the filter such that the combined resonant frequency of the two sets of one or more resonators will be inside the passband, as will be described herein.

As described above, in some embodiments the set of one or more reactive components is a capacitor. In other embodiments, the set of one or more reactive components is an inductor. In other embodiments, the one or more reactive components may be one or more capacitors. In other embodiments, the one or more reactive components may be one or more inductors.

The set of one or more resonators has a combined frequency, as a set, outside of the passband of the filter when considered in isolation, such that spurious modes present on the main mode of the one or more resonators is outside of the desired passband of the filter, as will be described herein. In embodiments, as described herein, in which the set of one or more reactive components is one or more resonators, the one or more resonators may have spurious modes. Therefore, the set of one or more reactive components has a frequency sufficiently far from the passband such that spurious modes on the main mode of the set of one or more reactive components has substantially subsided before, and are therefore not present within, the frequency range of the passband. It will be appreciated that in embodiments in which the set of one or more reactive components is one or more capacitors or one or more inductors, the set of one or more reactive components will not usually comprise spurious modes. The one or more reactive components, placed in series with the set of one or more resonators, results in the resonant frequency of the set of one or more resonators being shifted such that the resonant frequency of the one or more resonators is within the passband of the filter. However, the one or more reactive components do not couple as strongly to the spurious modes of the set of one or more resonators, S1, and therefore the spurious modes do not shift in frequency to the same extent as the resonant frequency and therefore do not shift into the passband of the filter. It will be understood, for example from the Butterworth Van-Dyke model, that an inductor in series with a resonator will shift the resonance frequency of the resonator down in frequency. A capacitor in series with a resonator will shift the resonance frequency of the resonator up in frequency. It will also be appreciated that in the embodiment in which the set of one or more reactive components is one or more resonators, the one or more resonators are chosen such that their resonant frequency is sufficiently far from the passband and the set of one or more resonators S1, such that the resonator will act like a capacitor, thus shifting the resonant frequency of the one or more resonators, S1, up in frequency. This will be described in more detail herein. It will be appreciated that the figures herein are for illustrative purposes only, and the set of one or more resonators, S1, and set of one or more reactive components, S2, maybe ordered such that the set of one or more reactive components is adjacent the antenna port, rather than the one or more resonators being adjacent the antenna port, as shown in FIGS. 4A and 4B. The order of S1 and S2 in the series does not affect the result.

Figure 5:
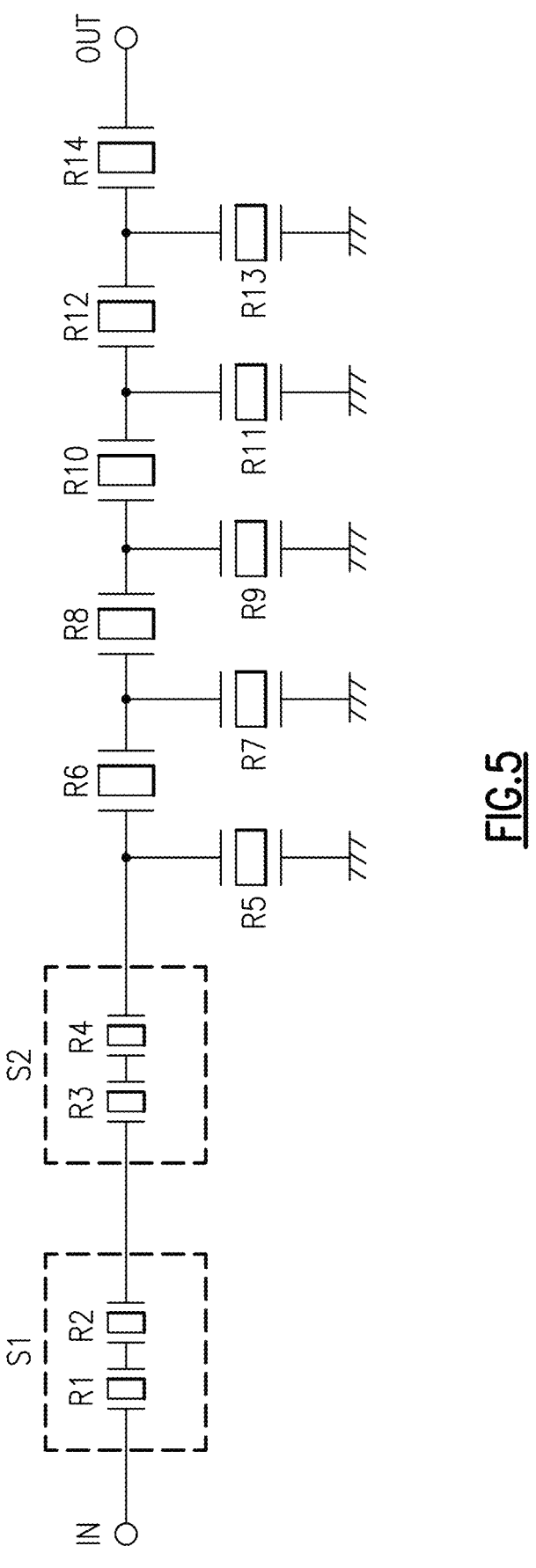
FIG. 5 is a ladder filter according to aspects of the present invention.

FIG. 5 illustrates a ladder filter implementing an embodiment of the invention, in which the set of one or more reactive components is two resonators. It will be appreciated that the other embodiments described herein, can be implemented in a ladder filter in the same way as described in FIG. 5. As shown, the first, S1, and second, S2, sets of one or more resonators are located at the first stage, towards the antenna port, of the series branch such that the first set is connected to the antenna port, and the second set is connected to the series branch of the ladder filter. As shown, the resonators R1, R2, R3 and R4, as described in relation to FIGS. 4A and 4B, are located such that they replace R1 as described in the known arrangement of FIG. 1A.

Figure 6A:
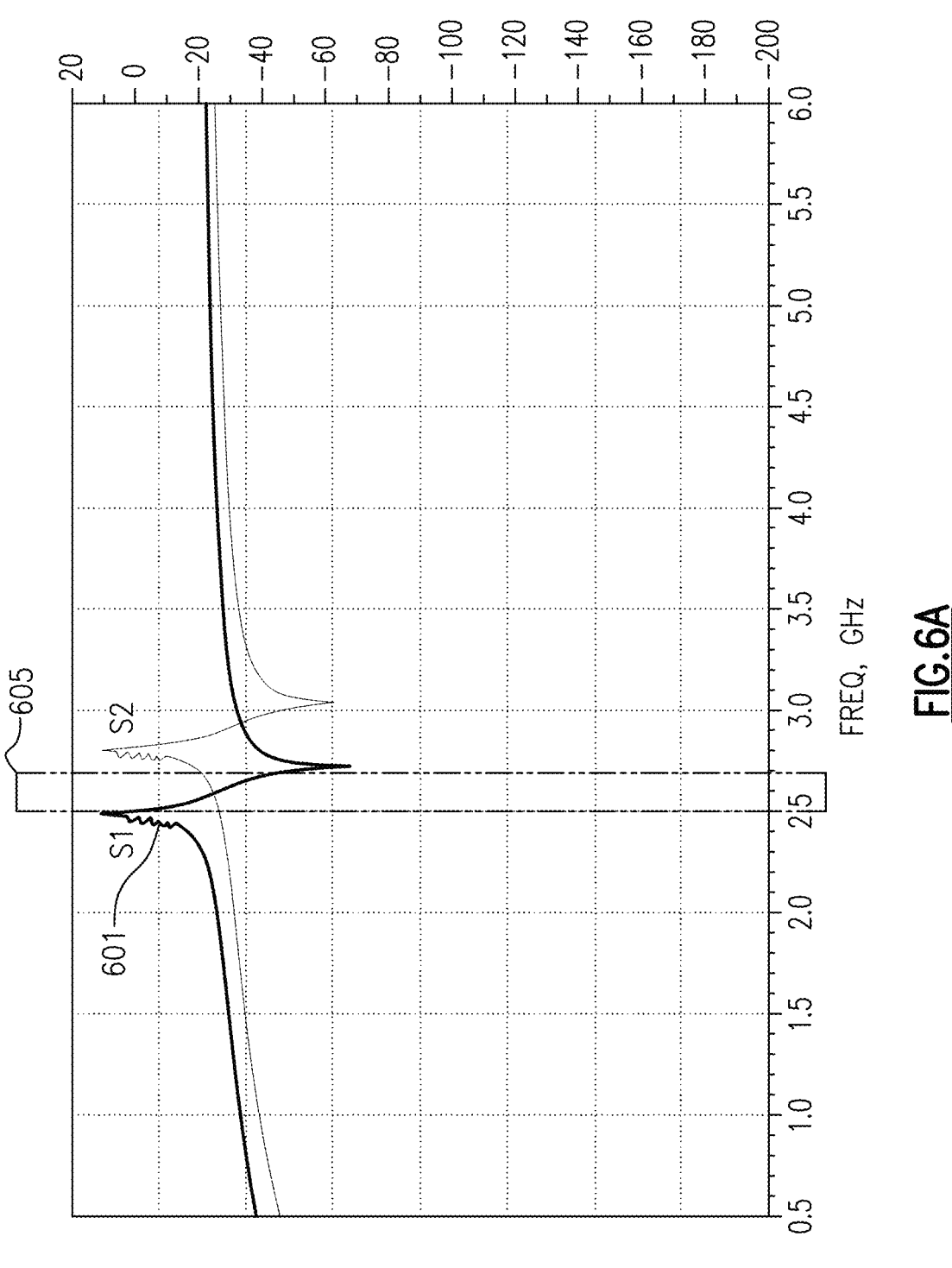
FIG. 6A is an example frequency response of the set of one or more resonators in a first stage of a series branch of a ladder filter according to an embodiment of the invention.

FIG. 6A shows the frequency responses of the set of one or more resonators, S1, and the set of one or more reactive components, S2, in an embodiment in which the set one or more resonators, S1, has a resonant frequency below the passband 605 of the filter (illustrated by the dashed lines), and the set of one or more reactive components, S2, has a resonant frequency above the passband of the filter. In this embodiment the one or more reactive components are resonators. It will be noted that in this embodiment, the resonant frequency of the set of one or more resonators S1 is required to be shifted up into the passband, and therefore the set of one or more reactive components may be one or more capacitors in series with the set of one or more resonators, resulting in a shift of the resonant frequency into the passband, as will be shown in FIG. 7. Alternatively, the set of one or more reactive components may be one or more resonators in series with first set of one or more resonators. The combined resonant frequency of the two sets of one or more resonators will be inside the passband. As shown, in this embodiment in which the second set of one or more reactive components are one or more resonators, the second set of resonators comprises spurious modes 601 on its main mode. Therefore, as shown in FIG. 6A, the set of one or more resonators, S1, and the set of one or more reactive components, S2, have resonant frequencies outside of the passband, such that the spurious modes are outside of the passband. It will be noted that the resonant frequency of S2 is sufficiently above the passband of the filter, such that the spurious modes have subsided at a frequency beyond the passband of the filter. It will be appreciated that the graph of FIG. 6A is for illustrative purposes only, and the frequency response may vary depending on the set of one or more resonators and the set of one or more reactive components used in the arrangements. It will be appreciated that although ideally the entirety of the spurious modes are outside of the passband, there may be some embodiments in which a small proportion of spurious modes are at frequencies within the passband of the filter. The spurious modes arising from each of the sets of resonators are therefore attenuated as they have frequencies outside of the passband of the filter. Therefore, the performance of the device is improved due to at least some of the spurious modes occurring at frequencies outside the passband of the filter.

Figure 6B:
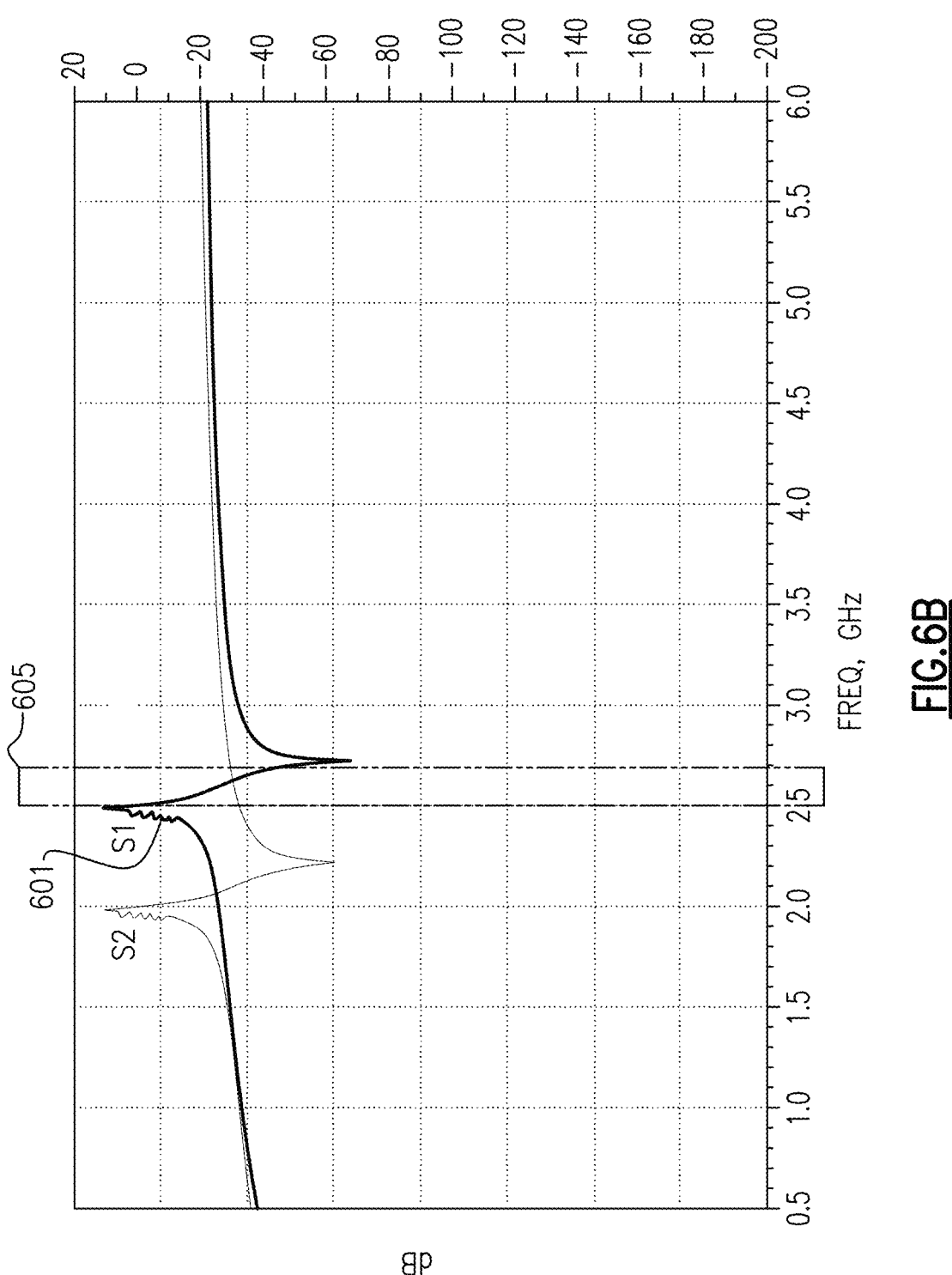
FIG. 6B is an example frequency response of the set of one or more resonators in a first stage of a series branch of a ladder filter according to an embodiment of the invention.

FIG. 6B shows an embodiment in which the resonant frequency of the set of one or more reactive components, S2, has a resonant frequency below the resonant frequency of set of one or more resonators, S1. In this embodiment, the one or more reactive components may be one or more resonators, where the resonant frequency of the one or more resonators of S2 is sufficiently below the passband of the filter and the resonance frequency of the one or more resonators of S1, that it acts like a capacitor in the active frequency range of the set of one or more resonators, S1. As shown in FIG. 6B, in the embodiment in which the second set of one or more reactive components are one or more resonators, the second set of resonators comprises spurious modes 601 on its main mode.

Figure 6C:
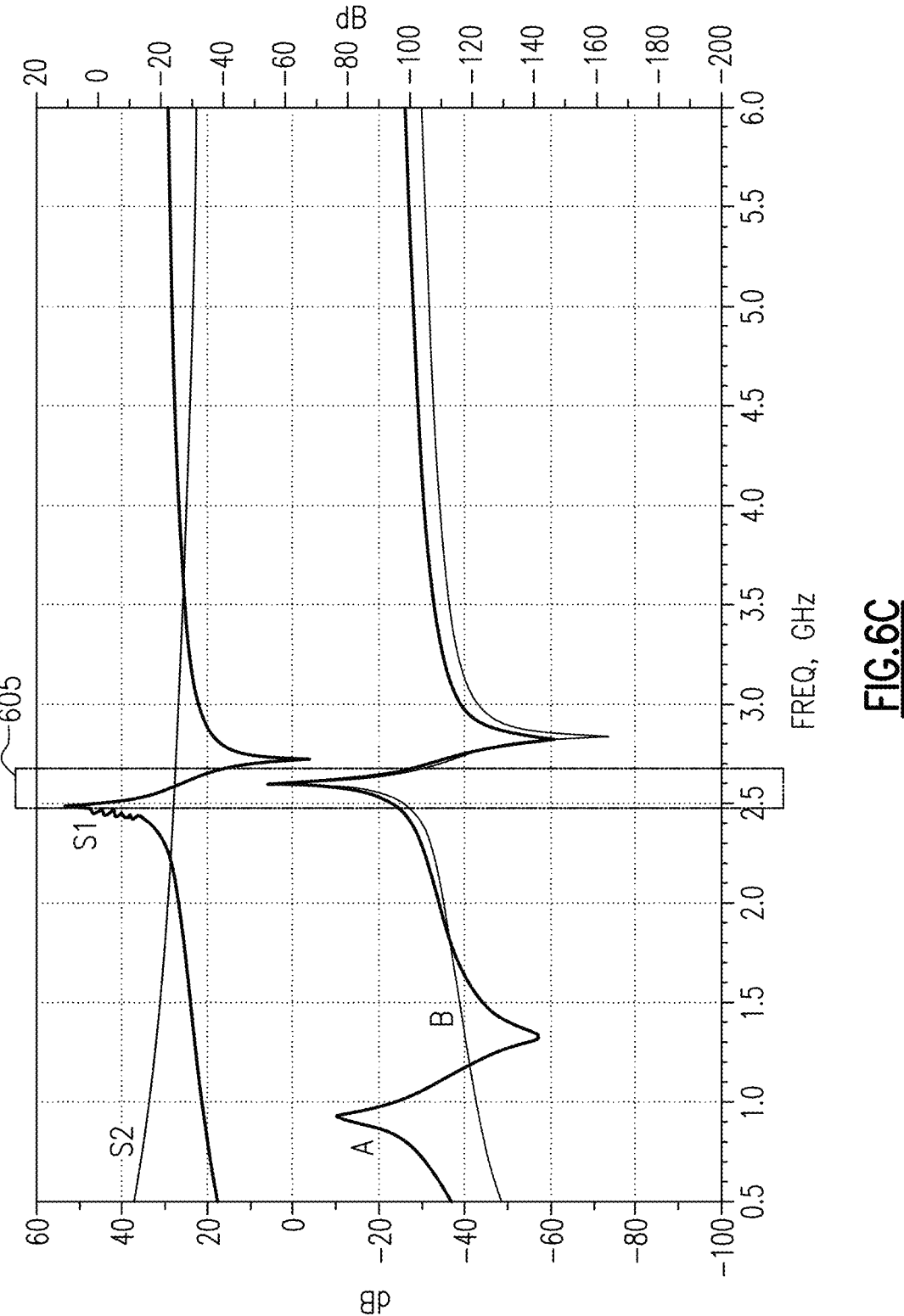
FIG. 6C is an example frequency response of the set of one or more resonators in a first stage of a series branch of a ladder filter according to an embodiment of the invention.

FIG. 6C shows an embodiment in which the one or more reactive components, S2, are one or more capacitors, and wherein the set of one or more resonators, S1, has a resonant frequency below the passband of the filter. The frequency response of the one or more inductors is shown by the line labelled S2. In both of these embodiments, as described above, the combination of the first set S1 and second set S2 results in shifting the resonant frequency of the set of one or more resonators, S1, up in frequency, such that the resultant resonant frequency is within the passband of the filter but the spurious modes remain outside the passband of the filter. The frequency response of the combination of S1 and S2 is shown by line labelled A, compared to the frequency response of the known arrangement of four resonators, as shown in FIG. 3A, which is labelled line B. The lines A and B use the scale on the left hand side, and the lines for the individual sets S1 and S2 use the scale on the right hand side. It will be appreciated that the graphs of FIGS. 6B and 6C are for illustrative purposes only, and the frequency response, and values, may vary depending on the set of one or more resonators and the set of one or more reactive components used in the arrangements.

Figure 6D:
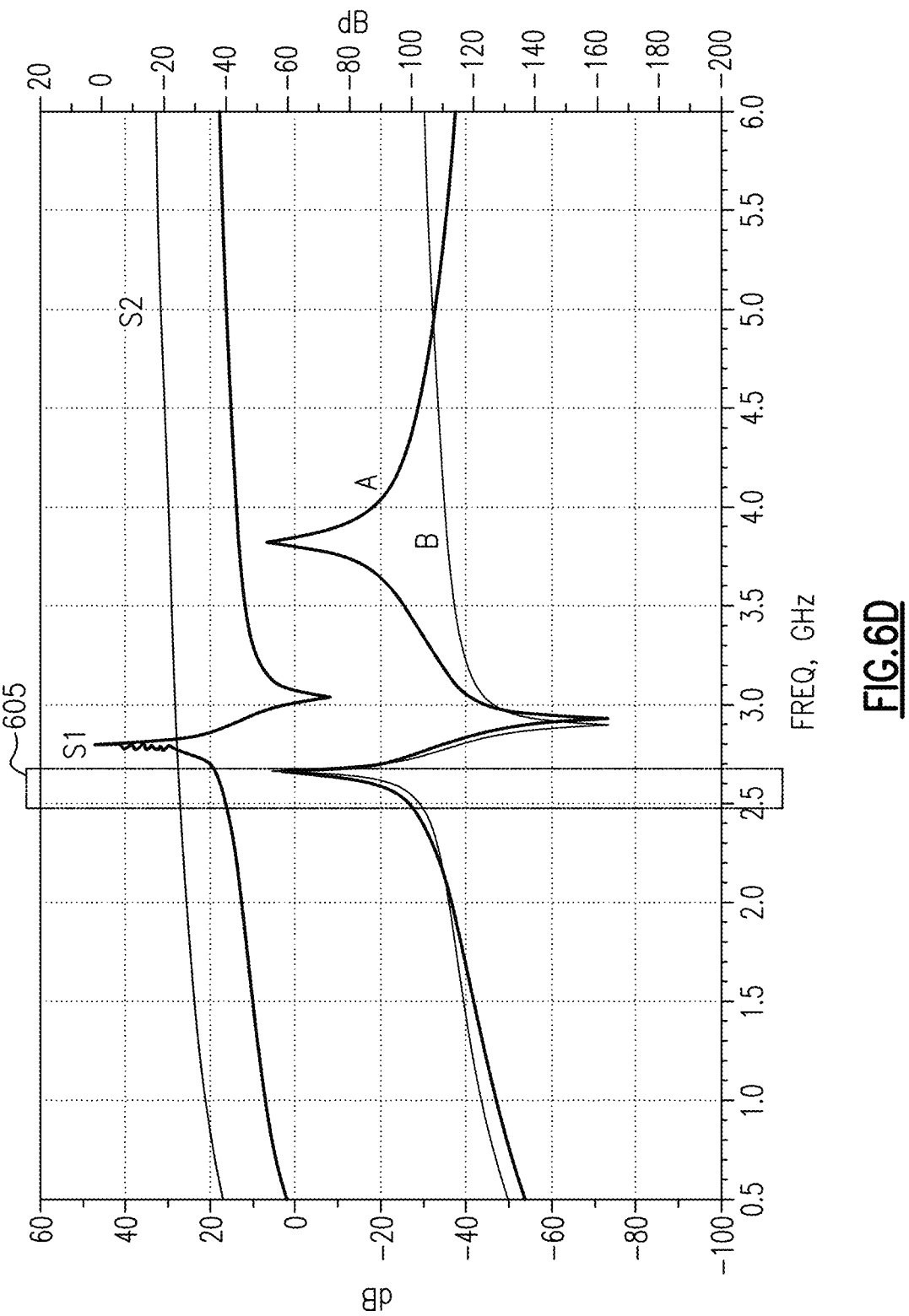
FIG. 6D is an example frequency response of the set of one or more resonators in a first stage of a series branch of a ladder filter according to an embodiment of the invention.

FIG. 6D shows an embodiment in which the resonant frequency of the one or more resonators, S1, is sufficiently above the passband of the filter, that the spurious modes of the main mode subside at a frequency beyond the passband of the filter, for example, the resonant frequency of S1 may be 100 MHz above the passband of the filter, as described in other embodiments herein. In the embodiment of 6D, the one or more reactive components may be one or more inductors, such that the inductors result in shifting the resonant frequency of the set of one or more resonators, S1, down into the passband. It will be appreciated, from FIG. 6D, that the same effect will occur in an embodiment in which the one or more inductors of S2 have resonant frequencies sufficiently above the passband of the filter, as well as the set of one or more resonators S2 having a resonant frequency sufficiently above the passband of the filter. The frequency response of the combination of S1 and S2 is shown by line labelled A, compared to the frequency response of the known arrangement of four resonators, as shown in FIG. 3A, which is labelled line B. The lines A and B use the scale on the left hand side, and the lines for the individual sets S1 and S2 use the scale on the right hand side. It will be appreciated that the graph of FIG. 6D is for illustrative purposes only, and the frequency response, and values, may vary depending on the set of one or more resonators and the set of one or more reactive components used in the arrangements.

Figure 7:
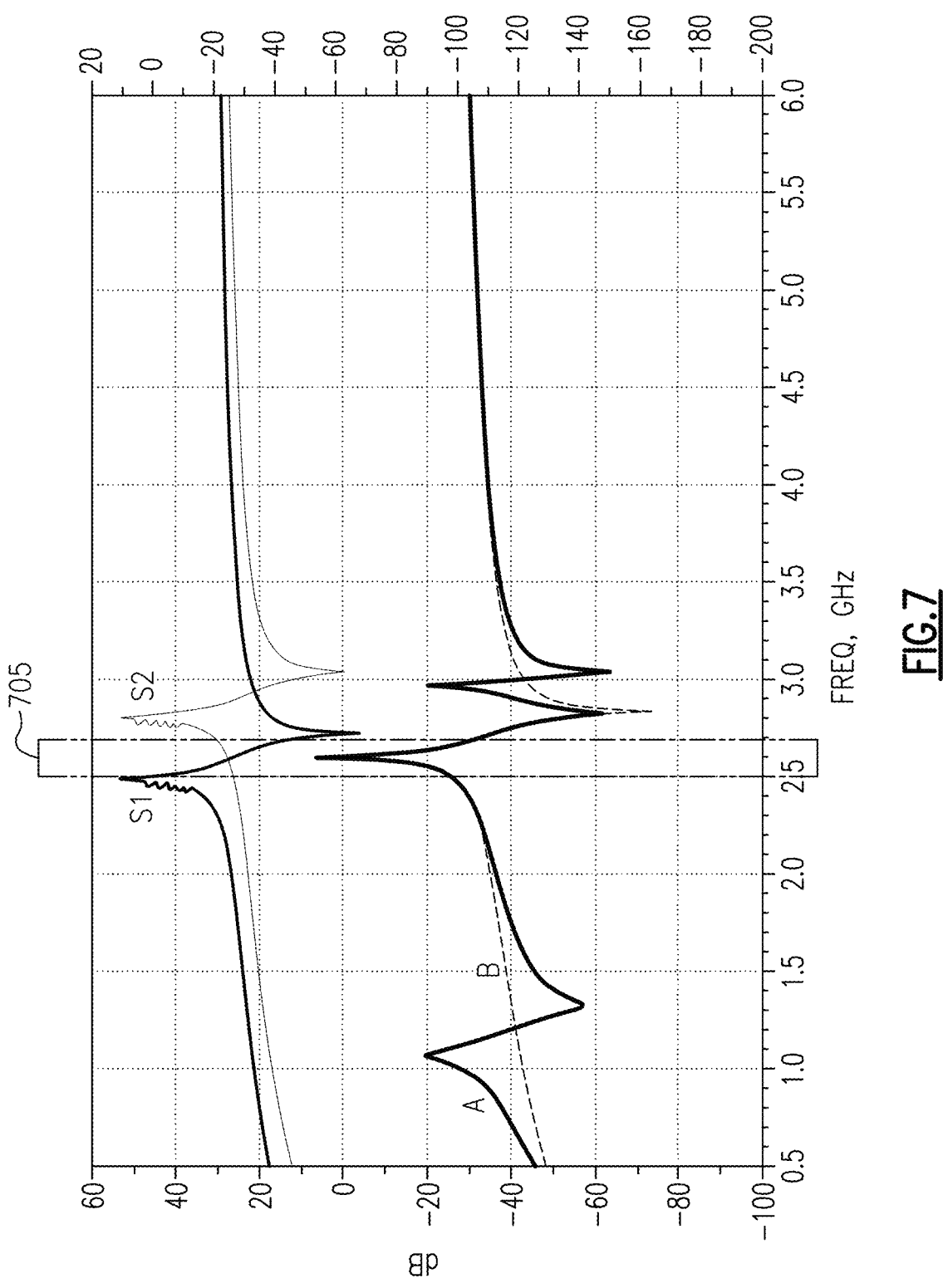
FIG. 7 shows an example frequency response of a first stage of a series branch of a ladder filter according to an embodiment of the invention and a frequency response of the known first stage of a series branch of a ladder filter.

FIG. 7 shows the frequency response of the set of one or more resonators, S1, in series with the one or more reactive components, S2, in either of the embodiments described in relation to FIGS. 6A and 6B. However, it will be appreciated that the same general effect will be seen in the embodiments described in relation to FIG. 6D in which S1 has a resonant frequency above the passband of the filter, and one or more inductor, S2, are placed in series with S1. The frequency response of the combination of S1 and S2 is shown by the solid line on the graph, labelled A. Ideally the resultant resonant frequency is approximately in the middle of the passband 705, shown by the dashed line in FIG. 7. In this example, in which the passband is 2496-2690 MHz, the resonant frequency of the set, S1, of resonators may be around 2490 MHz, and the resonant frequency of the set, S2, of reactive components may be around 2800 MHz. Therefore, the set of one or more reactive components has a resonant frequency around 100 MHz above the higher frequency edge of the passband. It has been calculated, that the second harmonic content will decrease by around 10 dB, for a reactive component with a resonant frequency 100 MHz above the edge of the passband, for the 2496-2690 MHz passband. However, a set of one or more reactive components with a resonant frequency more than 100 MHz above the edge of the passband may be chosen if the second harmonics of the set of one or more reactive components decreases more slowly away from the resonant frequency. Alternatively, a set of one or more reactive components with a resonant frequency less than 100 MHz above the edge of the passband, e.g. 50 MHz or 20 MHz above the upper edge of the passband, may be chosen if the second harmonics of the set of resonators decreases more rapidly away from the resonant frequency.

FIG. 7 shows the frequency responses of S1 and S2, represented by the two top lines and using the scale on the right hand side of the graph compared to the combination of the sets of resonators, shown by line A, as well as the frequency response of the known arrangement of a combination of four identical resonators described in relation to FIG. 3A, shown by the dashed line B, with lines A and B using the scale on the left hand side of the graph. As shown, the resonator arrangement according to the embodiments of the present invention has a resonant frequency equal to that of the known arrangement in the area within and near the passband.

The anti-resonant frequency of the set of one or more resonators and the set of one or more reactive components, unlike their resonance frequencies, does not shift when the sets are placed in series. This is because placing the one or more reactive components, which either act as a capacitor or an inductor, shifts the resonant frequency of the one or more resonators but not the anti-resonant frequency. Instead, as shown by FIGS. 6A-6D and 7, the set, S1, of one or more resonators has one anti-resonant frequency, and the one or more reactive components, S2, has a different anti-resonant frequency. The anti-resonant frequencies are shown by the troughs on the frequency response. The anti-resonant frequencies of the two sets, S1 and S2, can be seen in the combined frequency response of the two sets of resonators, shown by the line A. As required by a ladder filter, it will be seen from FIG. 7 that the anti-resonances of the cascaded two sets, S1 and S2, are outside of the passband, and the combined resonant frequency is within the passband. Therefore, it will be appreciated that the embodiments described herein, result in an improved performance of the filter, in which the spurious modes are not present within passband frequency, whilst the resonant and anti-resonant frequencies are in the correct frequency ranges.

As described above, the spurious modes are even more important when considering the second harmonics of the device. FIG. 8 shows the amplitude of the second harmonics with change in frequency, within the passband of the filter. The dashed line, labelled line D, shows the second harmonic response for a ladder filter not implementing embodiments of the present invention. The solid line, labelled line C, shows the second harmonic response for the ladder filter according to an embodiments of the present invention. It will be appreciated that the exact values of the harmonics will vary slightly between embodiments described herein, although the general results will be the same for all embodiments. As shown, the ladder filter implemented according to embodiments of the present invention has a much smaller second harmonic response due to the reduction of the spurious modes within the passband of the filter. The filter of embodiments of the present invention has an increased performance due to the removal of spurious modes within the passband. Although not shown, the third and fourth etc., harmonics of the known arrangement compared to embodiments of the present invention will have the same effect.

As described herein, embodiments of the present invention reduce the second harmonic content within the passband and therefore the invention provides a large signal advantage for the ladder filter. The reduction in the second harmonic content may be by around 10 dB. In addition to this large signal advantage, embodiments of the invention described herein may also provide a small signal advantage in the passband. In known ladder filter arrangements, the passband response has multiple small ripples starting from around the midpoint of the passband, i.e. around the resonant frequency of the series resonators, and continuing to lower frequencies. These ripples may be spurious modes. Each of these ripples results in a small reduction of signal being transferred through the ladder filter, and thus affects the performance of the ladder filter. Each of these ripples is around 1/10 or 2/10 dB and occurs every few MHz, which may result in a decrease in performance of the communication system, depending on the modulation being used.

These ripples in the passband create corresponding ripples in the phase and group delay, which manifest as bit errors in the communication system, resulting in a reduction in sensitivity. However, embodiments of the present invention reduce the occurrence of these ripples within the passband, providing a better sensitivity to the communication system.

Figure 9B:
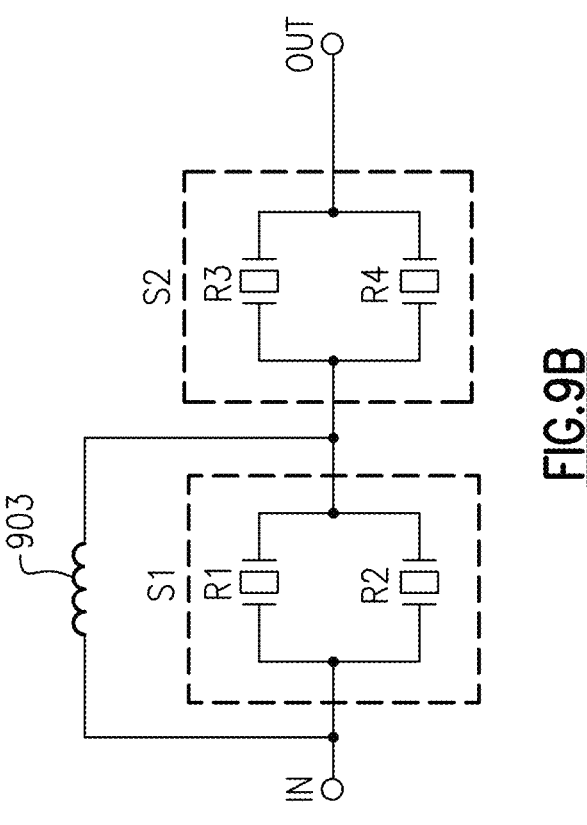
FIG. 9B is a first stage of a series branch of a ladder filter, including an inductor according to an embodiment of the invention.
Figure 9A:
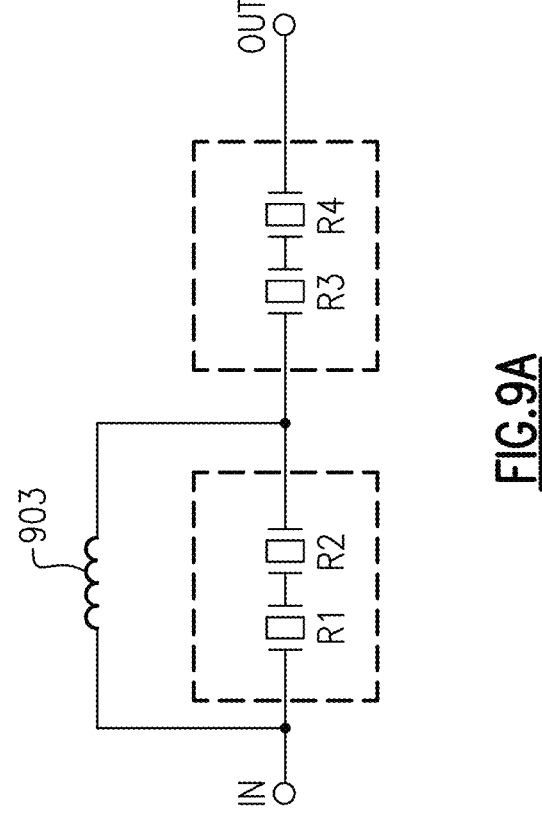
FIG. 9A is a first stage of a series branch of a ladder filter, including an inductor according to an embodiment of the invention.

In some embodiments of the present invention, the ladder filter further comprises an inductor placed in parallel with the set of one or more resonators, S1, as shown in FIGS. 9A and 9B. As discussed herein, a ladder filter requires series resonators to have resonant frequencies within the passband of the filter, and that the anti-resonant frequencies outside of the passband of the filter. In some embodiments, depending on the width of the passband, the set of one or more resonators, S1, may have an anti-resonant frequency within the passband. Therefore, there is a need to move this anti-resonant frequency out of the passband of the filter. This can be achieved using an inductor placed in parallel with the set of one or more resonators, S1.

FIGS. 9A and 9B, illustrate two embodiments, in which the one or more resonators, S1, has a resonant frequency below the passband of the filter, but an anti-resonant frequency within the passband of the filter. The inductor has the result that the anti-resonant frequency of the set of the one or more resonators is moved further from its resonant frequency, such that the anti-resonant frequency is pushed out of the passband of the filter. The inductor is chosen such that the anti-resonant frequency is moved sufficiently away from the resonant frequency that it is outside of the passband of the filter. For example, the inductor may be a 4 nH inductor. The piezoelectric layers of the acoustic devices described herein may have been described with respect to a specific example, though it will be appreciated that other compositions of piezoelectric layer may be used. The required piezoelectric material will be based upon, amongst other considerations, the desired frequency range of operation of the acoustic device. A non-exhaustive list of possible piezoelectric materials includes aluminum nitride (AlN) and aluminum nitride doped with one or more of scandium (Sc), yttrium (Y), hafnium (Hf), magnesium (Mg), tantalum (Ta); zinc oxide (ZnO); lithium niobate ($LiNbO_3$); lithium tantalate ($LiTaO_3$); lead titanate ($PbTiO_3$); and zirconium titanate ($ZrTiO_3$). BAW resonators typically use an aluminum nitride piezoelectric layer. In some embodiments, the resonators may comprise a piezoelectric material where the material of the second set of one or more resonators is chosen based on its piezoelectric coupling. The piezoelectric coupling sets the spread between the anti-resonant and resonant frequency of the resonator. If the set of one or more resonators, S1, comprises one or more resonators with a higher piezoelectric coupling, and thus spread, this may ensure that the anti-resonant frequency is outside of the passband of the filter. In this embodiment, the set of resonators, S1, could comprise one or more resonators with a lower piezoelectric coupling to result in the correct combined resonant frequency.

In some embodiments, the piezoelectric layer of the first set of one or more resonators may be the same, or a different thickness to the piezoelectric layer of the second set of one or more resonators. The change in thickness of the piezoelectric layer results in the frequency difference between the resonant and anti-resonant frequencies being changed. This may be required for the anti-resonant frequency to be outside of the passband, with the resonant frequency inside the passband.

In some embodiments, the one or more resonators are manufactured such that there is a mass loading effect. The mass loading may be in the metal layer, or the passivation layer of the resonator. Mass loading results in the shifting of resonant frequencies, and can be used on one or more resonators such that the resonant frequency is within the passband, and the anti-resonant frequency is outside of the passband.

In some embodiments, it may be necessary to modify the resonator arrangements of the embodiments described herein, and in particular to split resonators to share the load. For example each resonator may be replaced by two resonators arranged in parallel to each receive half of the load, and each resonator may also be half in size. This results in the total area of resonators being the same as the unmodified resonator arrangement, but it has the same frequency response. In known arrangements this may be problematic as the resonators placed in parallel have to be made perfectly symmetrical so that they align exactly in frequency, so that they result in one well-defined resonance frequency. However, this is difficult to achieve and any difference in resonators, such as a small difference in physical shape or size, or location on the die etc., may result in an uneven power distribution between the two resonators, causing one to heat more than the other at high power. When the resonators heat up, their frequency response changes, and thus when one resonator heats up due to dissipating more power than the other resonator, the resonance frequencies of each of the resonators of those in parallel shift apart. This results in a double resonance, such that the frequency response of the combined two resonators in parallel comprises two peaks close to each other, which are both within the passband of the filter. This results in a peak with a small notch in its center, i.e. between the resonant frequency peak of the first resonator of the resonators in parallel and the resonant frequency peak of the second resonator of the resonators in parallel. This notch in the passband results in a very large corresponding noise in the second harmonic response, resulting in decrease in harmonic performance of the filter. However, embodiments of the present invention overcome this problem. Replacing each resonator in a typical ladder filter with two resonators in parallel provides the advantage over known arrangements that the resonance frequency of each parallel resonator set will be outside of the passband. However, the combination of the set, S1, and set, S2, of resonators will result in the resonant frequencies being within the passbands, as required by the ladder filter. Therefore, any difference in the resonance frequency of the resonators in parallel of S1 will not result in a decrease in second harmonic performance of the ladder filter, unlike in known arrangements.

It will be appreciated, that although the present invention has been described in the example of BAW resonators, this invention may also be used in a ladder filter comprising surface acoustic wave (SAW) resonators. SAW resonators often exhibit a "Fresnel" response, which is a periodic fluctuation below the resonant frequency. This fluctuation, the Fresnel modes, therefore occur within the passband, and can pass through the filter unattenuated. Therefore, using the general techniques as described in the embodiments herein, these distortions may be moved to outside of the passband, whilst the resonant frequency is within the passband of the filter.

Figure 10:
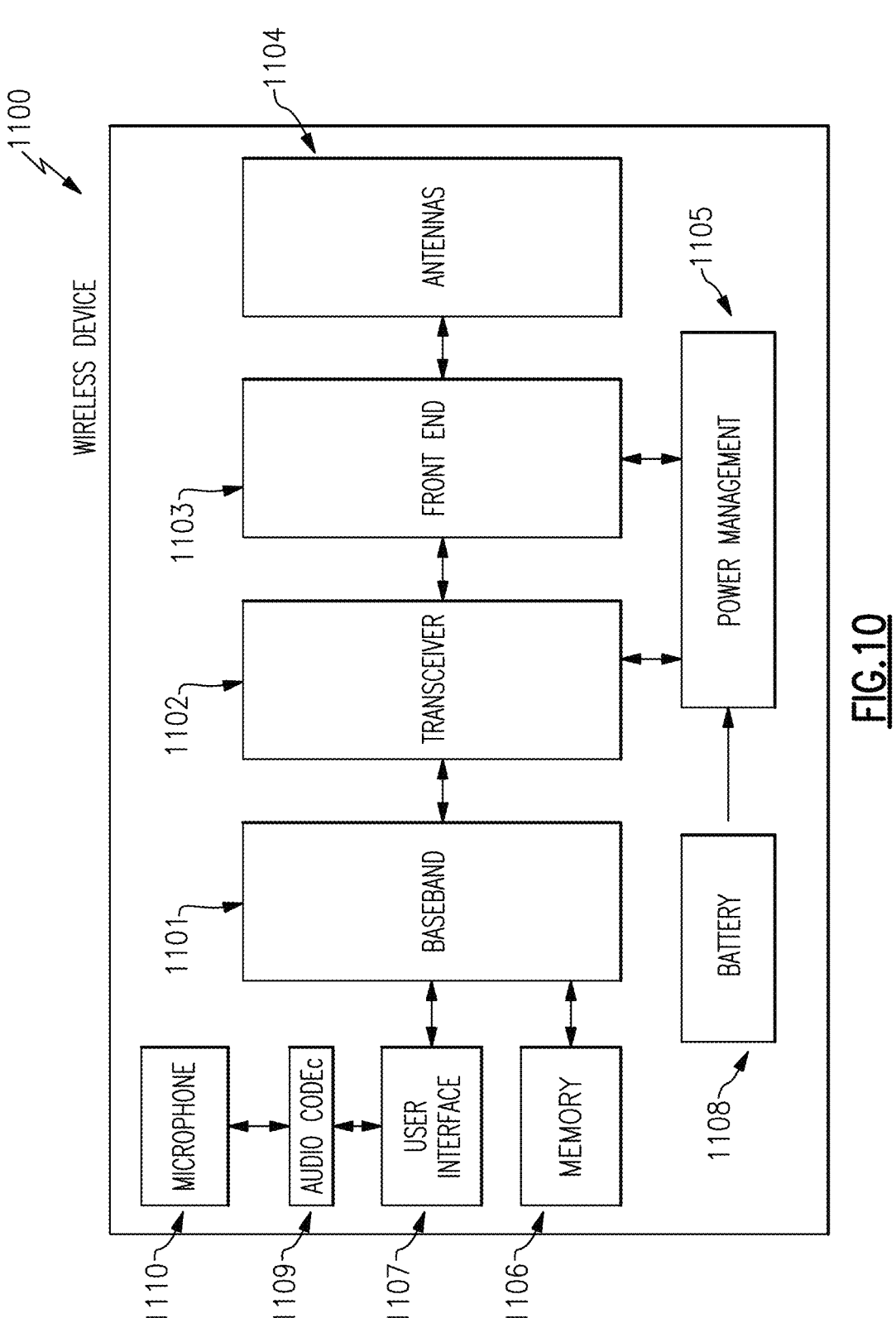
FIG. 10 is a schematic of a wireless device incorporating aspects of the present invention.

FIG. 10 is a schematic diagram of a wireless device 1100 that can incorporate aspects of the invention. The wireless device 1100 can be, for example but not limited to, a portable telecommunication device such as, a mobile cellular-type telephone. The wireless device 1100 can include a microphone arrangement 1100, and may include one or more of a baseband system 1101, a transceiver 1102, a front end system 1103, one or more antennas 1104, a power management system 1105, a memory 1106, a user interface 1107, a battery 1108, and audio codec 1109. The microphone arrangement may supply signals to the audio codec 109 which may encode analog audio as digital signals or decode digital signals to analog. The audio codec 1109 may transmit the signals to a user interface 1107. The user interface 1107 transmits signals to the baseband system 1101. The transceiver 1102 generates RF signals for transmission and processes incoming RF signals received from the antennas. The front end system 1103 aids in conditioning signals transmitted to and/or received from the antennas 1104. The antennas 1104 can include antennas used for a wide variety of types of communications. For example, the antennas 1104 can include antennas 1104 for transmitting and/or receiving signals associated with a wide variety of frequencies and communications standards. The baseband system 1101 is coupled to the user interface to facilitate processing of various user input and output, such as voice and data. The baseband system 1101 provides the transceiver 1102 with digital representations of transmit signals, which the transceiver 1102 processes to generate RF signals for transmission. The baseband system 1101 also processes digital representations of received signals provided by the transceiver 1102.

As shown in FIG. 10, the baseband system 1101 is coupled to the memory 1106 to facilitate operation of the wireless device 1100. The memory 1106 can be used for a wide variety of purposes, such as storing data and/or instructions to facilitate the operation of the wireless device 1100 and/or to provide storage of user information. The power management system 1105 provides a number of power management functions of the wireless device 1100. The power management system 1105 receives a battery voltage from the battery 1108. The battery 1108 can be any suitable battery for use in the wireless device, including, for example, a lithium-ion battery.

The passband filters described herein in accordance with the present invention may be incorporated into the wireless device 1100 of FIG. 10, in particular may be incorporated into the front end system 1103.

The passband filters described herein in accordance with the present invention may be incorporated into a radio-frequency front end (RFFE) module. An exemplary RFFE module is shown in FIG. 11. This figure illustrates a front end module 2200, connected between an antenna 2310 and a transceiver 2230. The front end module 2200 includes a duplexer 2210 in communication with an antenna switch 2250, which itself is in communication with the antenna 2310.

As illustrated, the transceiver 2230 comprises a transmitter circuit 2232. Signals generated for transmission by the transmitter circuit 2232 are received by a power amplifier (PA) module 2260 within the front end module 220 which amplifies the generated signals from the transceiver 2230. The PA module 2260 can include one or more PAs. The PA module 2260 can be used to amplify a wide variety of RF or other frequency-band transmission signals. For example, the PA module 2260 can receive an enable signal that can be used to pulse the output of the PE to aid in transmitting a wireless local area network (WLAN) signal or any other suitable pulsed signal. The PA module 2260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the PA module 2260 and associated components including switches and the like can be fabricated on gallium arsenide (GaAs) substrates using, for example, high electron mobility transistors (pHEMT) or insulated-gate bipolar transistors (BiFET), or on a silicon substrate using complementary metal-oxide semiconductor (CMOS) field effect transistors (FETs).

Still referring to FIG. 11, the front end module 2200 may further include a low noise amplifier (LNA) module 2270, which amplifies received signals from the antenna 2310 and provides the amplified signals to the receiver circuit 2234 of the transceiver 2230.

It should be appreciated that the BAW resonator illustrated in FIG. 2, along with other structures illustrated in the other figures accompanying this disclosure, are illustrated in a highly simplified form. The relative dimensions of the different features are not shown to scale. Further, embodiments comprising BAW resonators may include additional features or layers not illustrated or may lack one or more features or layers illustrated herein.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A radio frequency passband filter with a series branch, the series branch comprising:

a set of one or more resonators having a resonant frequency sufficiently away from the passband of the filter such that spurious modes, of the set of one or more resonators, that are associated with the resonant frequency are outside of the passband of the filter; and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

2. The radio frequency passband filter according to claim 1 wherein the one or more reactive components are one or more inductors.

3. The radio frequency passband filter according to claim 1 wherein the one or more reactive components are one or more capacitors.

4. The radio frequency passband filter according to claim 1 wherein the one or more reactive components are one or more resonators.

5. The radio frequency passband filter according to claim 1 wherein the set of one or more resonators has a resonant frequency above the passband of the filter.

6. The radio frequency passband filter according to claim 1 wherein the set of one or more resonators has a resonant frequency below the passband of the filter.

7. The radio frequency passband filter according to claim 1 wherein the set of one or more resonators has at least two resonators, the at least two resonators being connected in series to one another or anti-parallel to one another.

8. The radio frequency passband filter according to claim 1 wherein the set of one or more reactive components has at least two resonators, the at least two resonators being connected in series to one another or anti-parallel to one another.

9. The radio frequency passband filter according to claim 1 wherein the set of one or more resonators and set of one or more reactive components are located at a first stage, towards an antenna port, of the passband filter.

10. The radio frequency passband filter according to claim 1 wherein the series branch further includes an inductor connected in parallel with the set of one or more resonators.

11. The radio frequency passband filter according to claim 10 wherein the inductor has an inductance sufficient to move the anti-resonance of the set of one or more resonators out of the passband.

12. The radio frequency passband filter of claim 1 further comprising a substrate, where the set of one or more resonators and the set of one or more reactive components are disposed on a substrate.

13. The radio frequency passband filter of claim 12 wherein the substrate is a silicon wafer.

14. The radio frequency passband filter according to claim 1, wherein the set of one or more resonators have a piezoelectric layer of a first material, and the set of one or more reactive components have a piezoelectric layer of a second material, such that the combined resonant frequency is within the passband of the filter, and the anti-resonance frequency is outside of the passband of the filter.

15. The radio frequency passband filter according to claim 14, wherein the first and second materials are the same material.

16. The radio frequency passband filter according to claim 14, wherein the first and second materials are the same thickness.

17. The radio frequency passband filter according to claim 14, wherein the first and second materials are a different thickness to each other.

18. The radio frequency passband filter according to claim 1 wherein one or more of the resonators are manufactured such that there is a mass loading effect.

19. A radio-frequency module comprising:

a packaging substrate configured to receive a plurality of devices; and a die mounted on the packaging substrate, the die having a radio frequency passband filter, the passband filter having a series branch, the series branch including:

a set of one or more resonators having a resonant frequency sufficiently away from the passband of the filter such that spurious modes, of the set of one or more resonators, that are associated with the resonant frequency are outside of the passband of the filter; and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

20. A wireless mobile device comprising:

one or more antennas; and a radio-frequency module that communicates with the one or more antennas, the radio-frequency module having a die including a radio frequency passband filter with a series branch, the series branch having:

a set of one or more resonators having a resonant frequency sufficiently away from the passband of the filter such that spurious modes, of the set of one or more resonators, that are associated with the resonant frequency are outside of the passband of the filter; and a set of one or more reactive components in series with the set of one or more resonators, the set of one or more reactive components having a resonant frequency sufficiently away from the passband of the filter such that the spurious modes of the set of one or more reactive components, that are associated with the resonant frequency are outside of the passband, and such that the resulting combined resonant frequency of the series combination of the set of one or more resonators and the set of one or more reactive components is within the passband of the filter.

* * * * *